US007859339B2

(12) United States Patent
Ide (10) Patent No.: US 7,859,339 B2
(45) Date of Patent: Dec. 28, 2010

(54) DIFFERENTIAL AMPLIFICATION CIRCUIT

(75) Inventor: Akira Ide, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 52 days.

(21) Appl. No.: 12/285,598

(22) Filed: Oct. 9, 2008

(65) Prior Publication Data
US 2009/0096523 A1    Apr. 16, 2009

(30) Foreign Application Priority Data
Oct. 10, 2007    (JP) .............................. 2007-264532

(51) Int. Cl.
*H03F 3/45* (2006.01)
(52) U.S. Cl. ....................................... 330/257
(58) Field of Classification Search ................. 330/253, 330/257, 261
See application file for complete search history.

(56) References Cited

U.S. PATENT DOCUMENTS 4,334,196 A * 6/1982 Schade, Jr. ................. 330/253

2005/0140442 A1 * 6/2005 Tan ............................. 330/253
2005/0264347 A1 12/2005 Gyohten et al.

FOREIGN PATENT DOCUMENTS

| JP | 62-104305 | 5/1987 |
|---|---|---|
| JP | 01-086309 | 6/1989 |
| JP | 03-169107 | 7/1991 |
| JP | 05-014075 | 1/1993 |
| JP | 2005-340337 A | 12/2005 |

* cited by examiner

*Primary Examiner*—Steven J Mottola
(74) *Attorney, Agent, or Firm*—Foley & Lardner LLP (57) ABSTRACT

A differential amplification circuit is constituted of a differential transistor pair including a pair of n-channel MOS transistors whose sources are connected together, a constant current source circuit which is connected to the sources of the differential transistor pair, a current-mirror load circuit including a pair of p-channel MOS transistors whose gates are connected together, and a bias generation circuit which generates a gate bias voltage and a drain bias voltage applied to the current-mirror load circuit in such a way that the same potential is set to both the drains of the p-channel MOS transistors. Thus, it is possible to reduce the input offset voltage without reducing the margin of operation voltage and without increasing the overall chip size.

18 Claims, 12 Drawing Sheets

(RELATED ART)

FIG. 12

(RELATED ART)

FIG. 13

DIFFERENTIAL AMPLIFICATION CIRCUIT

BACKGROUND OF THE INVENTION

1. Field of the Invention

The present invention relates to differential amplification circuits for use in negative-feedback operational amplifiers.

The present application claims priority on Japanese Patent Application No. 2007-264532, the content of which is incorporated herein by reference.

2. Description of Related Art

Various types of differential amplification circuits and related circuitries have been developed and disclosed in various documents such as Patent Documents 1 to 5.

Patent Document 1: Japanese Unexamined Patent Application Publication No. 2005-340337

Patent Document 2: Japanese Unexamined Patent Application Publication No. H03-169107

Patent Document 3: Japanese Unexamined Patent Application Publication No. H05-014075

Patent Document 4: Japanese Unexamined Patent Application Publication No. S62-104305

Patent Document 5: Japanese Utility Model Application Publication No.

Different amplification circuits using current-mirror load circuits have been appropriately used for operational amplifiers because of high gains thereof. For example, Patent Document 1 is directed to a semiconductor integrated circuit device equipped with an internal voltage generation circuit which includes a voltage-follower circuit (i.e., a differential amplifier having a voltage-follower connection, see reference numeral 17 in FIG. 3), in which the input voltage is identical to the output voltage. In the present application, operational amplifiers are defined as differential amplification circuits having high amplification factors intensely subjected to feedback.

The present inventor has recognized the following problems, which will be described with reference to FIGS. 11 and 12.

Figure 11:
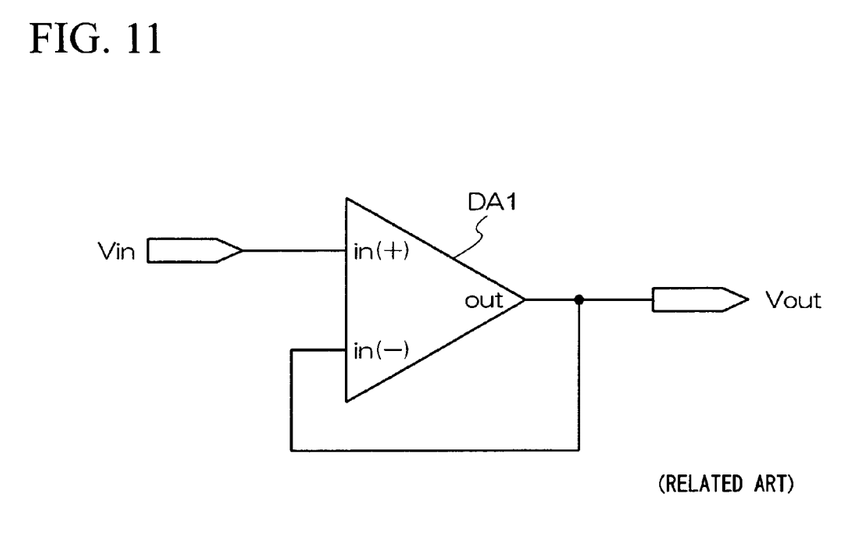
FIG. 11 is a circuit diagram showing a voltage follower circuit using an operational amplifier.

FIG. 11 shows a typical constitution of a voltage-follower circuit using an operational amplifier, i.e., a differential amplifier DA1 having a pair of a noninverting input terminal "in(+)" and an inverting input terminal "in(−)" as well as an output terminal "out". Herein, the inverting input terminal in(−) is connected to the output terminal out. The relationship between an input voltage Vin (applied to the noninverting input terminal in(+)) and an output voltage Vout in connection with the differential amplifier DA1 having a gain A is expressed as follows:

Vout=A(Vin−Vout)

Vout=(1−δ)Vin≈Vin $$\delta = \frac{1}{A+1}$$

In the above, if A=∞ so that δ=0, Vout=Vin, precisely. However, it is impossible to realize infinite gain; hence, an input offset voltage δVin should inevitably occur.

The occurrence of the input offset voltage will be described in detail with respect to a voltage-follower circuit shown in FIG. 12. In FIG. 12, the voltages of nodes OUTb and OUT are designated as V(OUTb) and V(OUT) respectively. If the voltage-follower circuit of FIG. 12 is placed in a ideal operation condition, the output voltage V(OUT) is identical to the input voltage V(IN), and the relationship of $I_1=I_2=I_0/2$ is established among currents $I_1$, $I_2$, and $I_0$ flowing through p-channel MOS (Metal Oxide Semiconductor) transistors M3 and M4 and an n-channel MOS transistor M0. In the ideal operation condition, not only the gate-source voltages of the transistors M3 and M4 but also the drain-source voltages of the transistors M3 and M4 should be equal to each other because of the relationship of $I_1=I_2$. Hence, V(OUT)=V(OUTb)=VDD−$|V_{GS3}|$, where VDD designates a supply voltage, and $V_{GS3}$ designates a gate-source voltage of the transistor M3. In other words, the ideal operation condition is the point that V(IN) is just equal to VDD−$|V_{GS3}|$. If the input voltage V(IN) differs from VDD−$|V_{GS3}|$, the output voltage V(OUT) follows up with the input voltage V(IN). This makes the drain voltage of the transistor M3 differ from the drain voltage of the transistor M4; hence, $I_1 \neq I_2$. The difference between $I_1$ and $I_2$ causes the gate-source voltage of a transistor M1 to differ from the gate-source voltage of a transistor M2. By use of a differential drain resistance rsd4 of the transistor M4, a current difference Al between the currents $I_1$ and $I_2$ is expressed as follows:

$$\Delta I = I_2 - I_1 = \frac{V(OUTb) - V(OUT)}{rds4}$$

Due to the current difference ΔI, the voltage difference should occur in a gate-source voltage $V_{GS}$ with respect to the transistors M1 and M2. By use of a mutual conductance gm2 of the transistor M2, a variation $\Delta V_{GS}$ of the gate-source voltage $V_{GS}$ is expressed as follows:

$$\Delta V_{GS} = \frac{\Delta I}{gm2}$$

Figure 12:
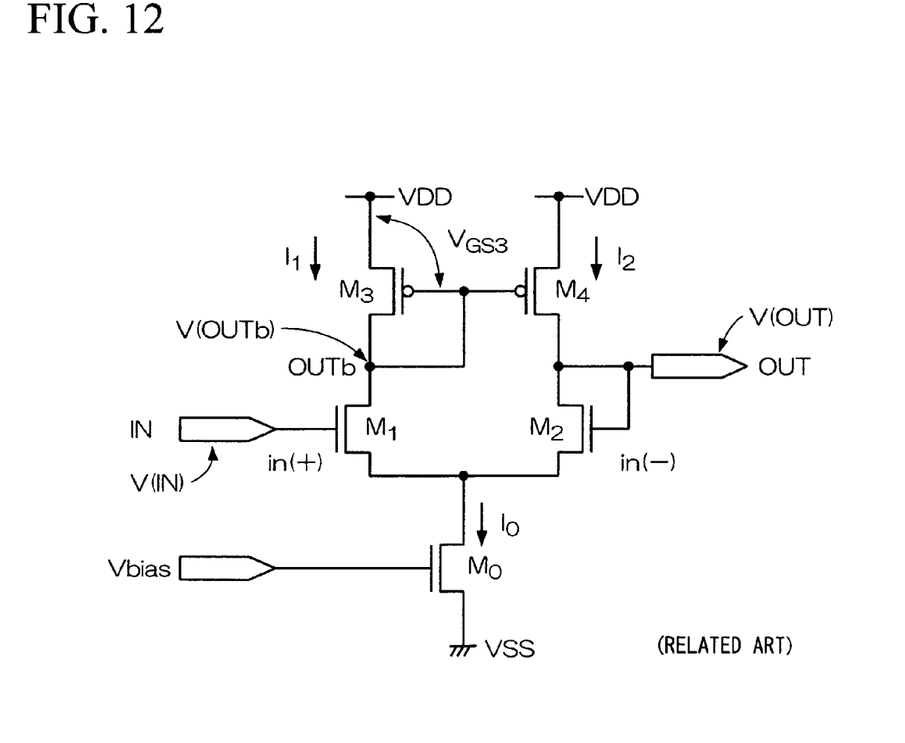
FIG. 12 is a circuit diagram showing a voltage follower circuit using a differential amplifier.

Therefore, an input offset voltage Voffset of the voltage-follower circuit of FIG. 12 is expressed by equation (1).

$$\begin{aligned}Voffset &= V(OUT) - V(IN) \\ &= V_{GS2} - V_{GS1} \\ &= \Delta V_{GS2} \\ &= \frac{V(OUTb) - V(OUT)}{rds4 \cdot gm2}\end{aligned} \quad (1)$$

Figure 13:
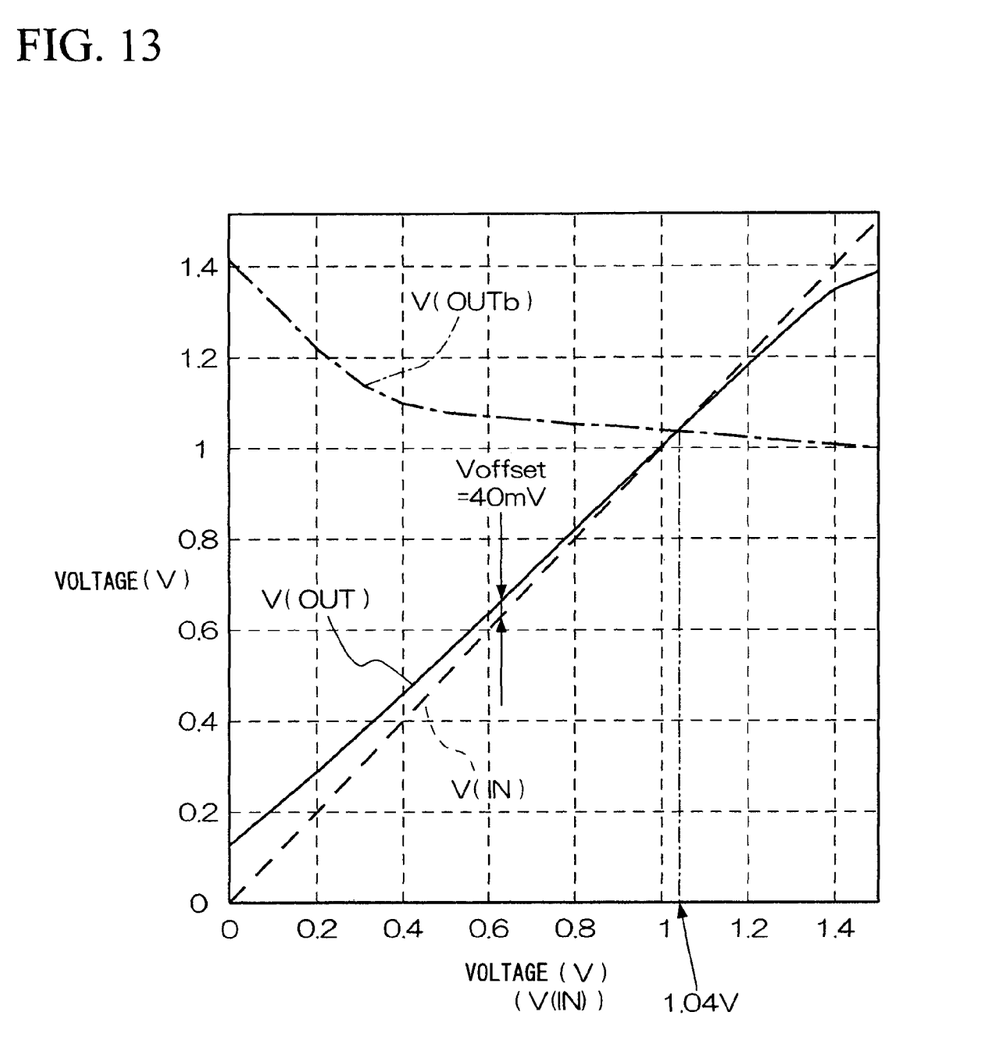
FIG. 13 is a graph showing the relationship between the input voltage and the output voltage in the voltage follower circuit shown in FIG. 12.

Equation (1) clearly shows the following points (1) and (2) in conjunction with a graph of FIG. 13 showing the relationship between V(IN), V(OUT), V(OUTb), and Voffset.

(1) In the condition in which V(OUTb) equals V(OUT), that is, when the drain voltage of the transistor M3 equals to the drain voltage of the transistor M4, the input offset voltage becomes zero.

(2) In other conditions, it is impossible to make the input offset voltage become zero because of the finite differential drain resistance rds4 of the transistor M4 which results in the finite gain rds4·gm2.

The above calculation neglects the differential drain resistances of the n-channel transistors M1 and M2; however, even when the calculation is modified in consideration of the differential drain resistances, the above conclusion is still sustained without change.

In order to reduce the input offset voltage, it is necessary to increase the differential drain resistance rds4 of the transistor M4 (forming a current-mirror load circuit) by increasing the gate length of the transistor M4. Due to a tradeoff between the gate length and the overall area of the transistor M4, when the gate length is adequately increased to neglect the input offset voltage, the overall chip area should be increased so as to push up the manufacturing cost.

It may be possible to form a cascode current mirror circuit in which an additional p-channel MOS transistor is connected in series to the drain of the transistor M4 applying the prescribed bias voltage to the gate thereof. However, the cascode current mirror circuit suffers from a problem in that the margin of operation voltage should be reduced by the drain voltage of the transistor newly connected in series.

In FIG. 12, VSS designates a ground voltage, and the n-channel MOS transistor functions as a constant current circuit for producing the current $I_0$. A current mirror circuit (or a bias voltage generation circuit, not shown) is introduced to control the gate voltage of the transistor M0 such that the drain-source current thereof matches the current $I_0$.

SUMMARY

The invention seeks to solve one or more of the above problems, or to improve upon those problems at least in part.

In one embodiment, there is provided a differential amplification circuit that includes a differential transistor pair which is constituted of a pair of n-channel MOS transistors whose gates are connected to a pair of differential input terminals and whose sources are connected together; a constant current source circuit which is connected between the sources of the differential transistor pair and the ground; a current-mirror load circuit which is constituted of a pair of p-channel MOS transistors whose gates are connected together, whose sources are connected to the voltage supply, and whose drains are connected to the drains of the n-channel MOS transistors forming the differential transistor pair; and a bias generation circuit for generating a gate bias voltage and a drain bias voltage applied to the p-channel MOS transistors forming the current-mirror load circuit in such a way that the same potential is set to both of the drains of the p-channel MOS transistors.

In the above, the bias generation circuit generates the gate bias voltage and the drain bias voltage applied to the p-channel MOS transistors of the current-mirror load circuit in such a way that the same potential is applied to the drains of the p-channel MOS transistors. Thus, it is possible to reduce the input offset voltage because the same drain voltage is applied to the p-channel MOS transistors of the current-mirror circuit. In contrast to the cascode current-mirror load circuit, the present invention does not reduce the margin of operation voltage so much.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

1. First Embodiment

Figure 1:
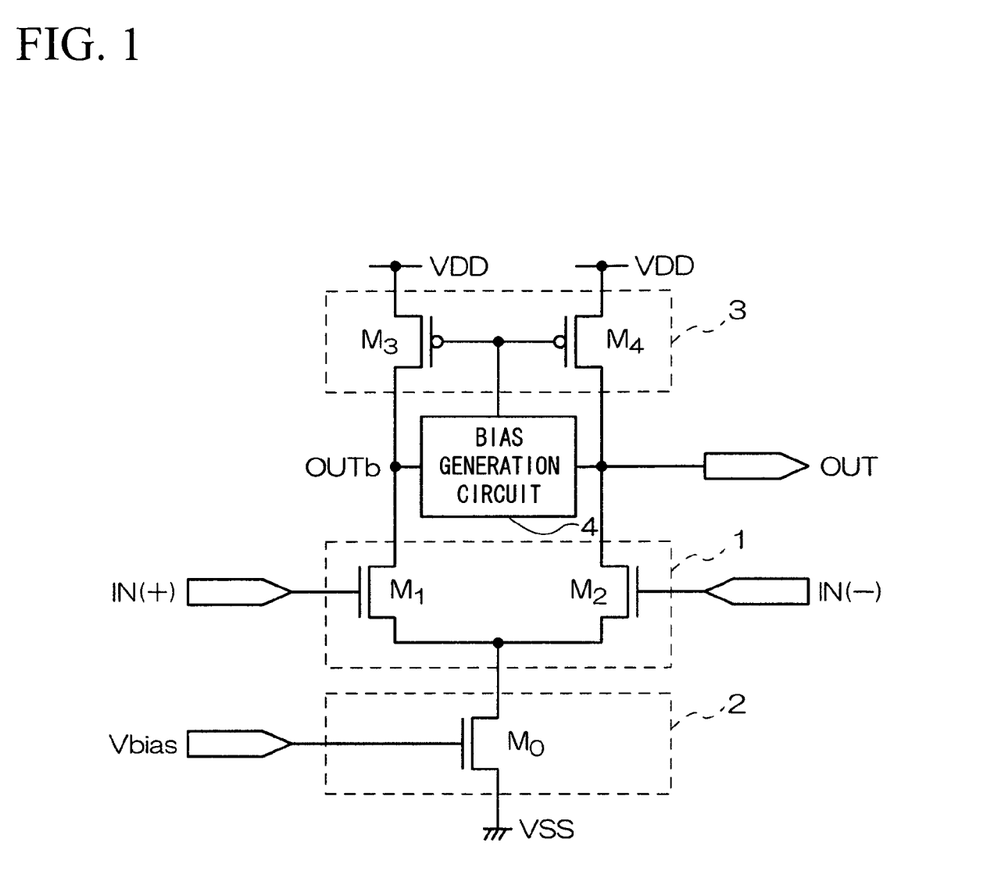
FIG. 1 is a block diagram showing the basic constitution of a differential amplification circuit according to the present invention.
Figure 2:
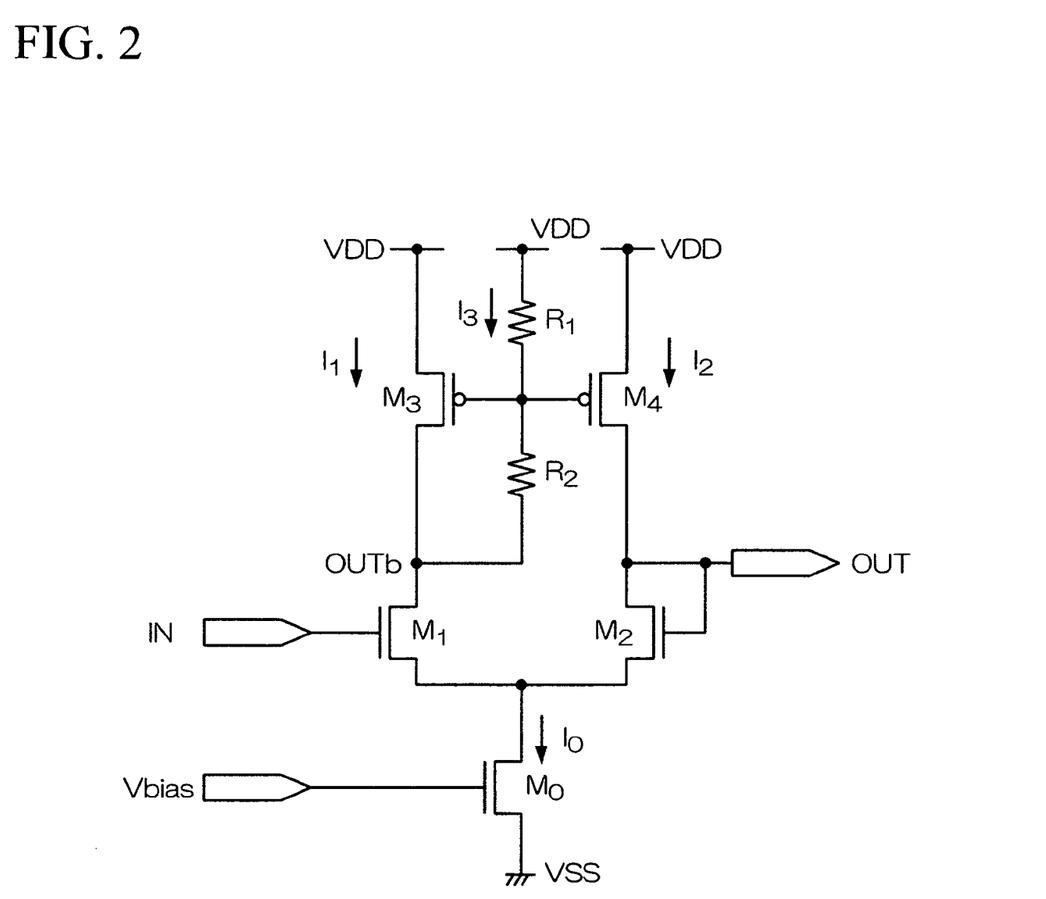
FIG. 2 is a circuit diagram showing the detailed constitution of the differential amplification circuit according to a first embodiment of the present invention, which serves as a voltage follower circuit.

FIG. 1 is a block diagram showing the basic constitution of a differential amplification circuit according to the present invention. FIG. 2 is a circuit diagram showing the detailed constitution of the differential amplification circuit serving as a voltage follower circuit according to a first embodiment of the present invention.

First, the basic constitution of the differential amplification circuit will be described with reference to the block diagram of FIG. 1, wherein parts identical to those shown in FIG. 12 are designated by the same reference numerals. The differential amplification circuit of FIG. 1 includes a differential transistor pair 1 in which a first differential input terminal IN(+) and a second differential input terminal IN(−) are connected to the gates of the n-channel MOS transistors M1 and M2 whose sources are connected together, a constant current source circuit 2 which is constituted of the n-channel MOS transistor M0 connected between the sources of the transistors M1 and M2 and the ground VSS, a current-mirror load circuit 3 constituted of the p-channel MOS transistors M3 and M4 in which the gates thereof are connected together, the sources thereof are connected to the voltage source VDD, and the drains thereof are connected to the drains of the transistors M1 and M2 (included in the differential transistor pair 1), and a bias generation circuit 4 which generates the gate bias voltage and drain bias voltage for the transistors M3 and M4 (included in the current-mirror load circuit 3) so as to make the voltage V(OUTb) match the voltage V(OUT).

In FIG. 1, the gate voltage of the n-channel MOS transistor M0 is controlled by a current mirror circuit (or a bias generation circuit, not shown) which is connected to a terminal Vbias so as to make the drain current thereof match the prescribed constant current.

The differential amplification circuit of the first embodiment shown in FIG. 2 is designed such that the bias generation circuit 4 (included in the differential amplification circuit of FIG. 1) is constituted of resistors R1 and R2 which are connected in series, wherein it forms the voltage follower circuit in which the gates of the transistors M1 and M2 serve as the differential input terminals, i.e., the first differential input terminal IN(+) and the second differential input terminal IN(−). Specifically, the gate of the transistor M1 is connected to the input terminal IN, while the gate of the transistor M2 is connected to the output terminal OUT and is also connected to the drain thereof so as to form the voltage follower circuit. The sources of the transistors M1 and M2 are connected together so as to form the differential transistor pair 1. The constant voltage Vbias is applied to the gate of the transistor M0, which is connected between the common source of the differential transistor pair 1 and the ground VSS and which thus forms the constant current source circuit 2 causing the constant current $I_0$ flowing therethrough.

The gates of the transistors M3 and M4 are connected together, the sources thereof are connected to the voltage supply VDD, and the drains thereof are connected to the drains of the transistors M1 and M2 which form the differential transistor pair 1, thus forming the current-mirror load circuit 3. In order to apply the gate bias voltage to the current-mirror load circuit 3 and to apply the drain bias voltage to the transistor M3, the resistor R1 is connected between the gates of the transistors M3 and M4 and the voltage supply VDD while the resistor R2 is connected between the gate and the drain of the transistor M3, whereby the resistors R1 and R2 form the bias generation circuit 4 shown in FIG. 1.

Next, the operation of the voltage follower circuit of the first embodiment shown in FIG. 2 will be described with reference to FIG. 3. The first embodiment is applicable to the situation in which the target values for the input voltage of the input terminal IN and the output voltage of the output terminal OUT are determined in advance, for example, the situation in which a constant reference voltage is subjected to buffering so as to apply the prescribed voltage to a relatively heavy load. It can also be applied to constant multiplier circuits.

By use of a gate-source voltage $V_{GS3}$ of the transistor M3, a drain-source voltage $V_{DS3}$ of the transistor M3 can be expressed as follows:

$$V_{DS3} = V_{GS3} \cdot \frac{R1 + R2}{R1}$$

The gate-source voltage $V_{GS3}$ is required to make a current $I_0/2$ flow through the transistor M3 and can be regarded as a constant value. By use of a target voltage (i.e., the constant output voltage at the output terminal OUT) $V_0$, a drain-source voltage $V_{DS4}$ of the transistor M4 is expressed as $V_{DS4}=V_0-$ VDD. In order to establish the relationship of $V_{DS3}=V_{DS4}$, it is necessary to set the ratio R2/R1 in accordance with equation (2).

$$\frac{R2}{R1} = \frac{V_0 - VDD}{V_{GS3}} - 1 \tag{2}$$

In the above, it is necessary to select relatively high resistances for the resistors R1 and R2 so as to establish the relationship of $I_0/2=I_1=I_2 \gg I_3$ with respect to a current $I_3$ flowing through the resistors R1 and R2 relative to the drain current $I_0$ of the transistor M0, the drain current $I_1$ of the transistor M3, and the drain current $I_2$ of the transistor M4. When the resistors R1 and R2 are determined to establish the equation (2), there is established the relationship of $V_{DS3}=V_{DS4}$ at the "target" voltage $V_0$; that is, the relationship of V(OUTb)−V(OUT)=0 is established in the equation (1), hence, the input offset voltage Voffset becomes zero.

FIG. 13 shows the relationship between the input voltage and the output voltage in the voltage follower circuit of FIG. 12, wherein the horizontal axis represents the input voltage V(IN) at the input terminal IN, and the vertical axis represents the output voltage V(OUT) at the output terminal OUT, the voltage V(OUTb) at a connection point OUTb, and the input voltage V(IN) at the input terminal IN. FIG. 13 shows that the voltage V(OUTb) becomes identical to the output voltage V(OUT) at the input voltage V(IN) of 1.04 V. In consideration of a target voltage of 0.65 V, an input offset voltage of about 40 mV occurs so that the error thereof is 6.1%, which cannot be neglected.

Figure 3:
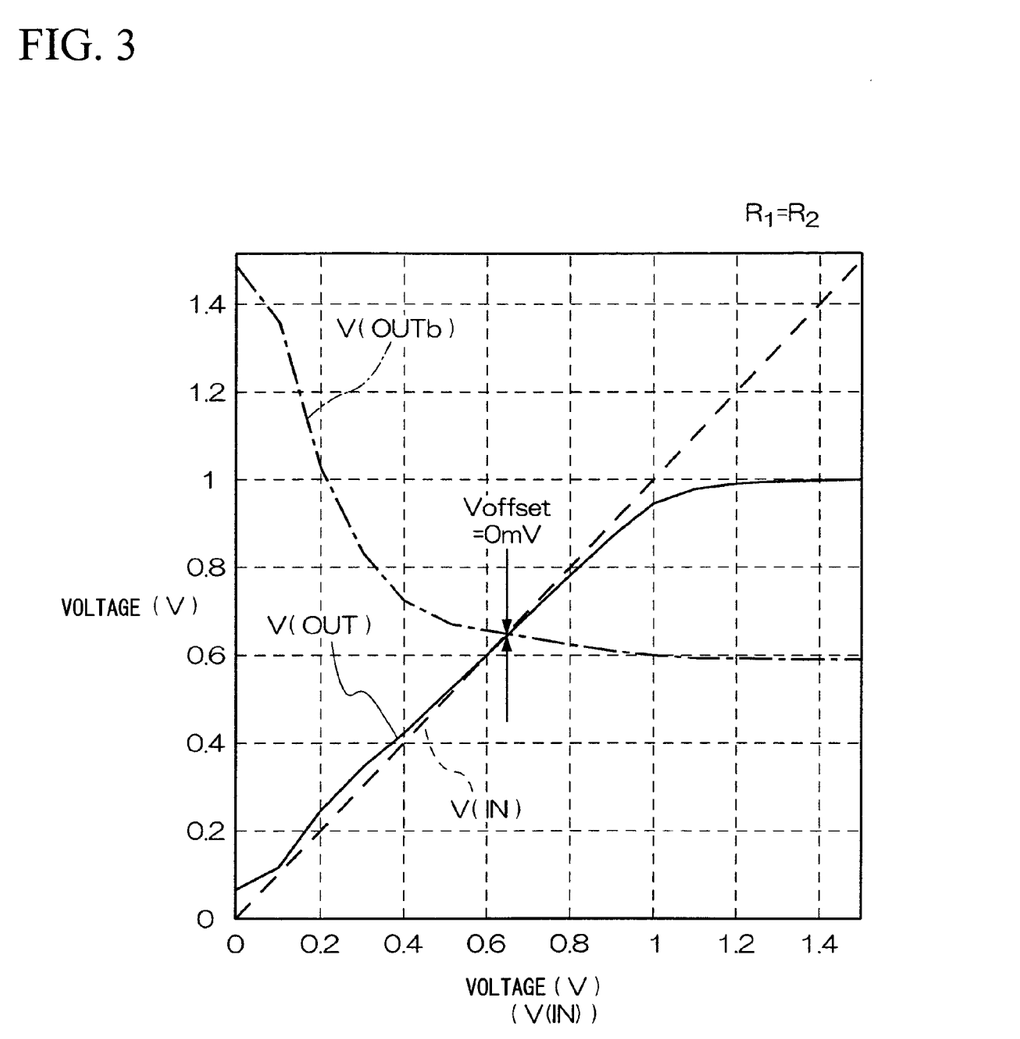
FIG. 3 is a graph showing the relationship between the input voltage and the output voltage in the voltage follower circuit shown in FIG. 2.

In connection with the graph of FIG. 13, FIG. 3 shows the relationship between the input voltage and the output voltage in the voltage follower circuit of the first embodiment shown in FIG. 2. In the graph of FIG. 3, the intersecting point between V(OUT) and V(OUTb) is set close to the target voltage, i.e., $V_0$=0.65 V, when R1=R2. This indicates that the input offset voltage becomes zero in proximity to the target voltage $V_0$=0.65 V.

2. Second Embodiment

Figure 4:
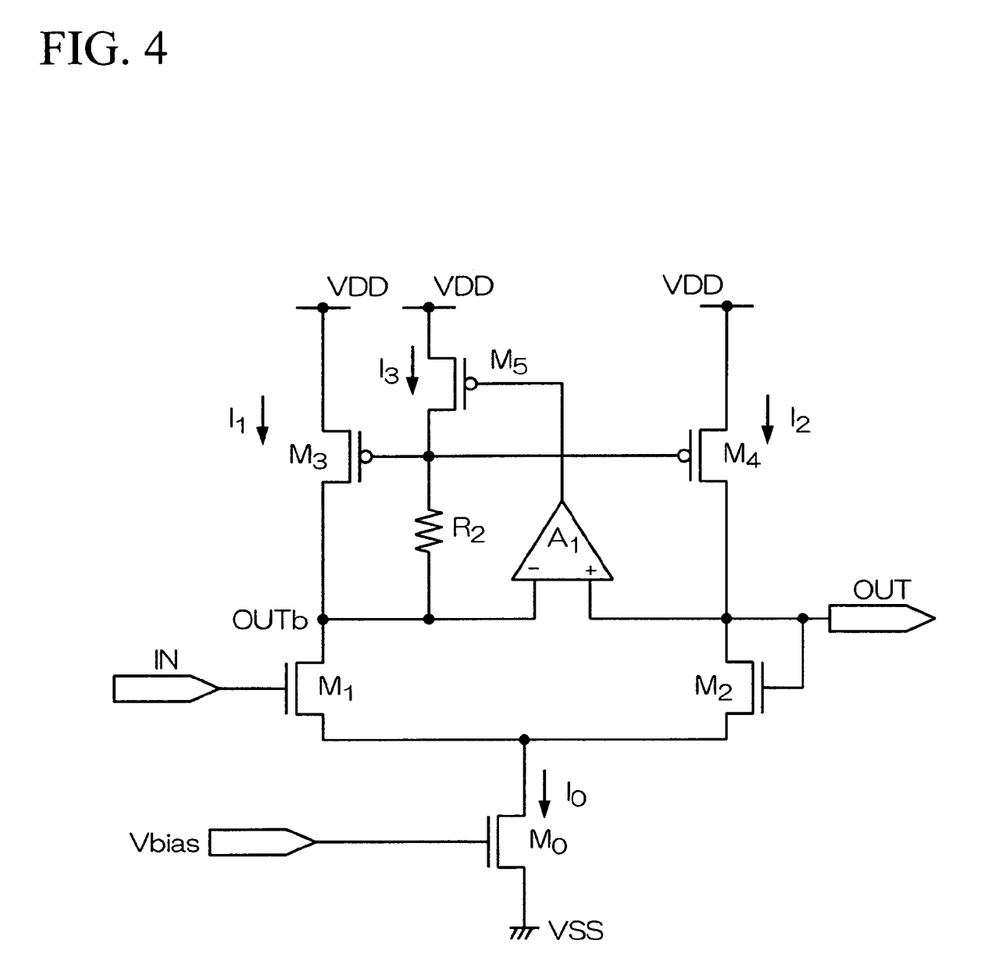
FIG. 4 is a circuit diagram showing the constitution of a differential amplification circuit according to a second embodiment of the present invention, which serves as a voltage follower circuit.

FIG. 4 shows the constitution of a differential amplification circuit according to a second embodiment of the present invention, which serves as a voltage follower circuit. The first embodiment shown in FIG. 2 is applicable to the situation in which the target voltage is determined in advance, whereas the second embodiment shown in FIG. 4 is capable of suppressing the input offset voltage in a relatively broad range of the input voltage V(IN). In FIG. 4, the parts identical to those shown in FIG. 2 are designated by the same reference numerals.

Compared with the first embodiment of FIG. 2, the resistor R1 is replaced with a p-channel MOS transistor M5 whose gate voltage is controlled in response to the output voltage V(OUT) (in other words, the gate voltage is controlled so as to eliminate the voltage difference between the output voltage V(OUT) and the voltage V(OUTb) of the connection point OUTb), thus making it possible for the second embodiment to cope with the arbitrary target voltage. A differential amplifier A1 is introduced as a gate voltage control circuit adapted to the transistor M5, wherein the noninverting input terminal (+) thereof is connected to the output terminal OUT while the inverting input terminal (−) thereof is connected to the connection point OUTb. In the voltage follower circuit of FIG. 4, the transistor M5 operates as a variable resistor; hence, the operation principle of the second embodiment for making the voltage V(OUTb) match the output voltage V(OUT) is identical to that of the first embodiment.

Figure 5:
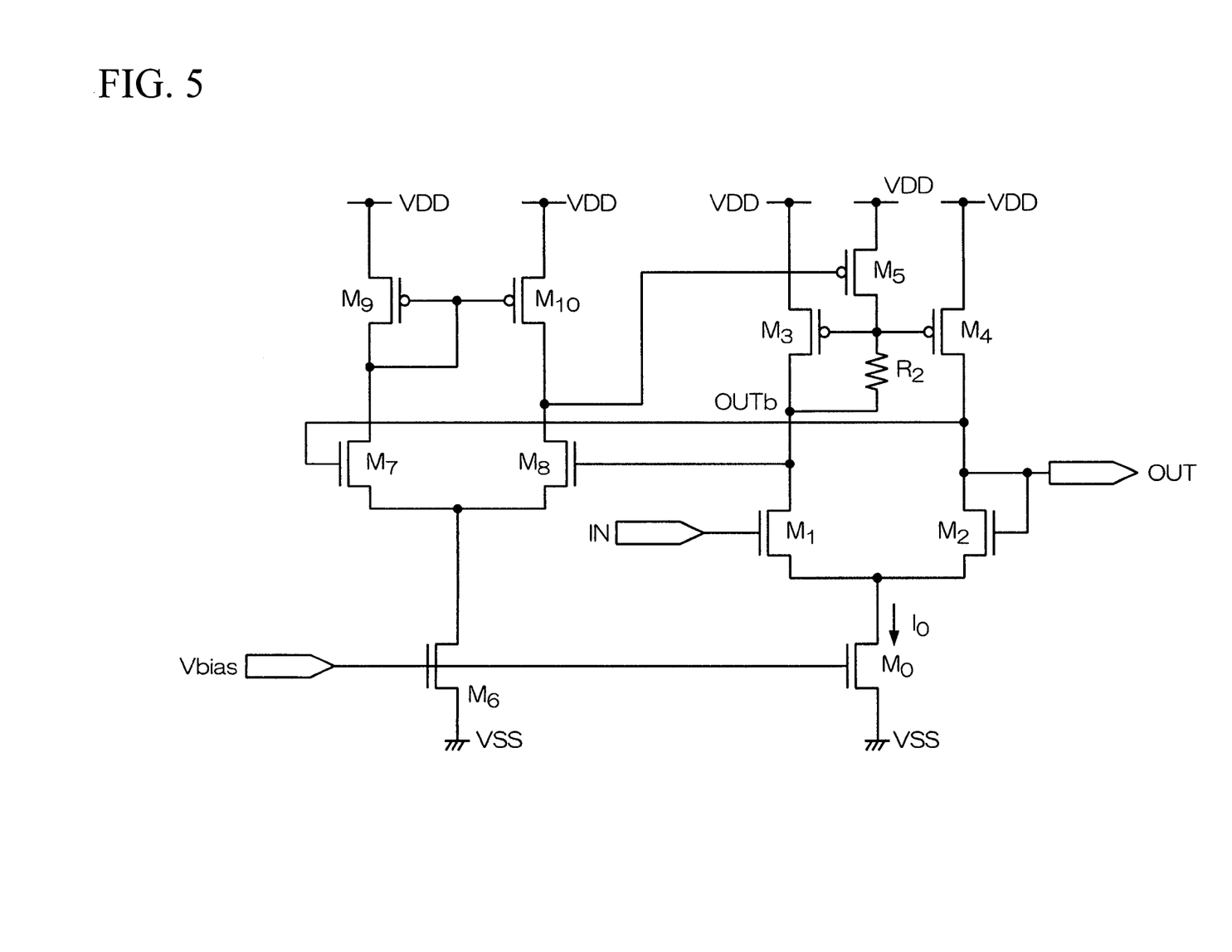
FIG. 5 is a circuit diagram showing the detailed constitution of a gate voltage control circuit adapted to the voltage follower circuit of FIG. 4.

FIG. 5 shows the detailed constitution of the gate voltage control circuit included in the voltage follower circuit of FIG. 4, wherein the differential amplifier A1 is constituted of n-channel MOS transistors M6 to M8 and p-channel MOS transistors M9 and M10. Specifically, the gates of the transistors M9 and M10 are connected together; the drains of the transistors M7 and M8 are connected to the drains of the transistors M9 and M10, and the gate of the transistor M7 is connected to the output terminal OUT while the gate of the transistor M8 is connected to the connection point OUTb; and the drain of the transistor M6 is connected to the sources of the transistors M7 and M8, and the gate of the transistor M6 is connected to the terminal Vbias. In addition, the sources of the transistors M9 and M10 are connected to the voltage supply VDD; the gate and drain of the transistor M9 are connected together; the drain of the transistor M8 is connected to the gate of the transistor M5; and the source of the transistor M6 is connected to the ground VSS.

Figure 6:
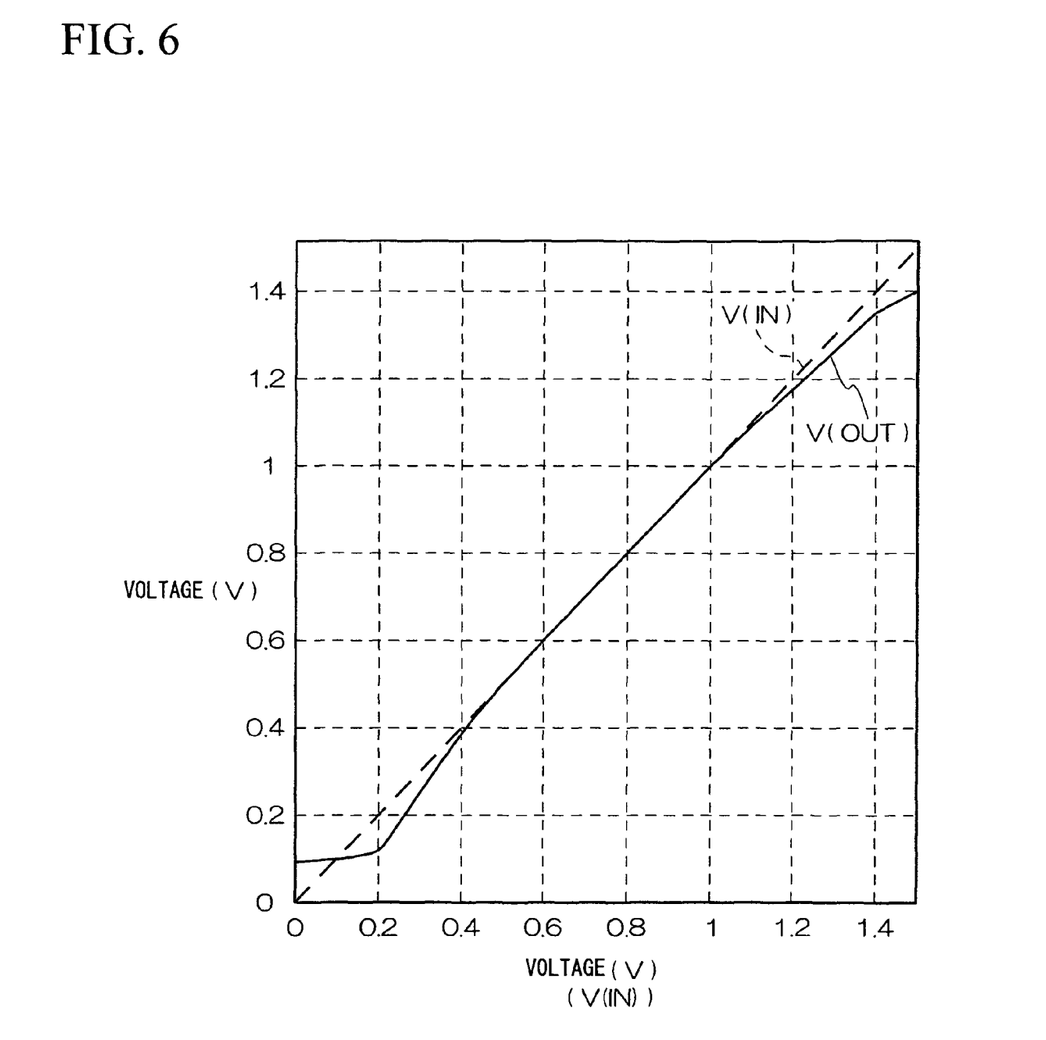
FIG. 6 is a graph showing the relationship between the input voltage and the output voltage in the voltage follower circuit of FIG. 4.

FIG. 6 shows the relationship between the input voltage and the output voltage in the voltage follower circuit of FIG. 5. It clearly shows that the input offset voltage is suppressed in a relatively broad range of the input voltage V(IN) ranging from 0.4 V to 1.1 V, for example.

3. Third Embodiment

Figure 7:
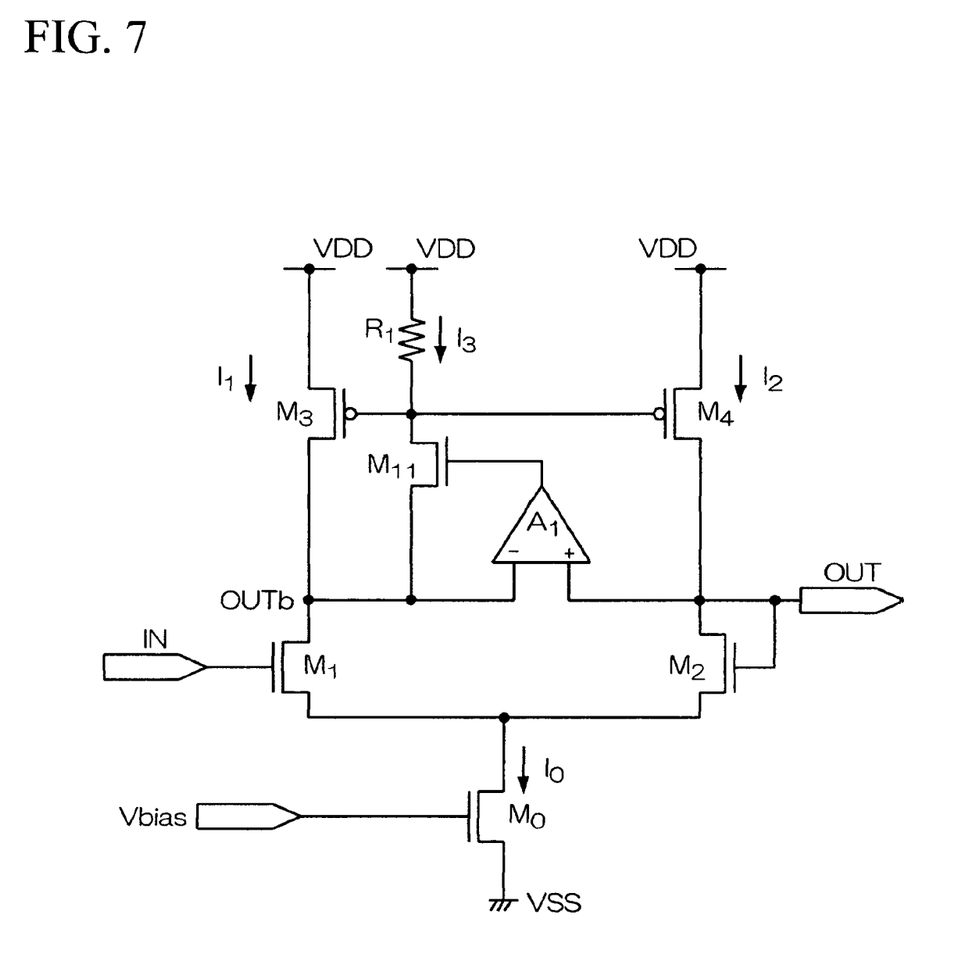
FIG. 7 is a circuit diagram showing the constitution of a differential amplification circuit according to a third embodiment of the present invention, which serves as a voltage follower circuit.

FIG. 7 shows the constitution of a differential amplification circuit according to a third embodiment of the present invention, which serves as a voltage follower circuit, wherein the parts identical to those shown in FIGS. 2 and 6 are designated by the same reference numerals. Compared to the first embodiment of FIG. 2, the resistor R2 is replaced with an n-channel MOS transistor M11 whose gate voltage is controlled in response to the output voltage V(OUT) (in other words, the gate voltage is controlled so as to eliminate the voltage difference between the output voltage V(OUT) and the voltage V(OUTb) of the connection point VOUTb), thus making the third embodiment cope with the arbitrary target voltage. The differential amplifier A1 is introduced as a gate voltage control circuit for controlling the gate voltage of the transistor M11, wherein the noninverting input terminal (+) thereof is connected to the output terminal OUT while the inverting input terminal (−) thereof is connected to the connection point OUTb. In the third embodiment, the transistor M11 does not function as a variable resistor but a source follower circuit. The gate voltage of the transistor M11 is expressed as V(OUT)+$V_{GS11}$, where $V_{GS11}$ represents the gate-source voltage of the transistor M11, which is determined such that a voltage drop R1·$I_3$ of the resistor R1 becomes identical to the gate-source voltage $V_{GS3}$ of the transistor M3. Since $V_{GS3}$ and $V_{GS11}$ do not substantially depend upon V(OUT) so that they can be regarded as constant values, the transistor M11 functions as the source follower circuit. By way of the transistor M11 and the differential amplifier A1, the voltage V(OUTb) of the connection point is controlled to match the output voltage V(OUT) of the output terminal OUT; hence, the input offset voltage becomes zero in accordance with equation (1).

4. Fourth Embodiment

Figure 8:
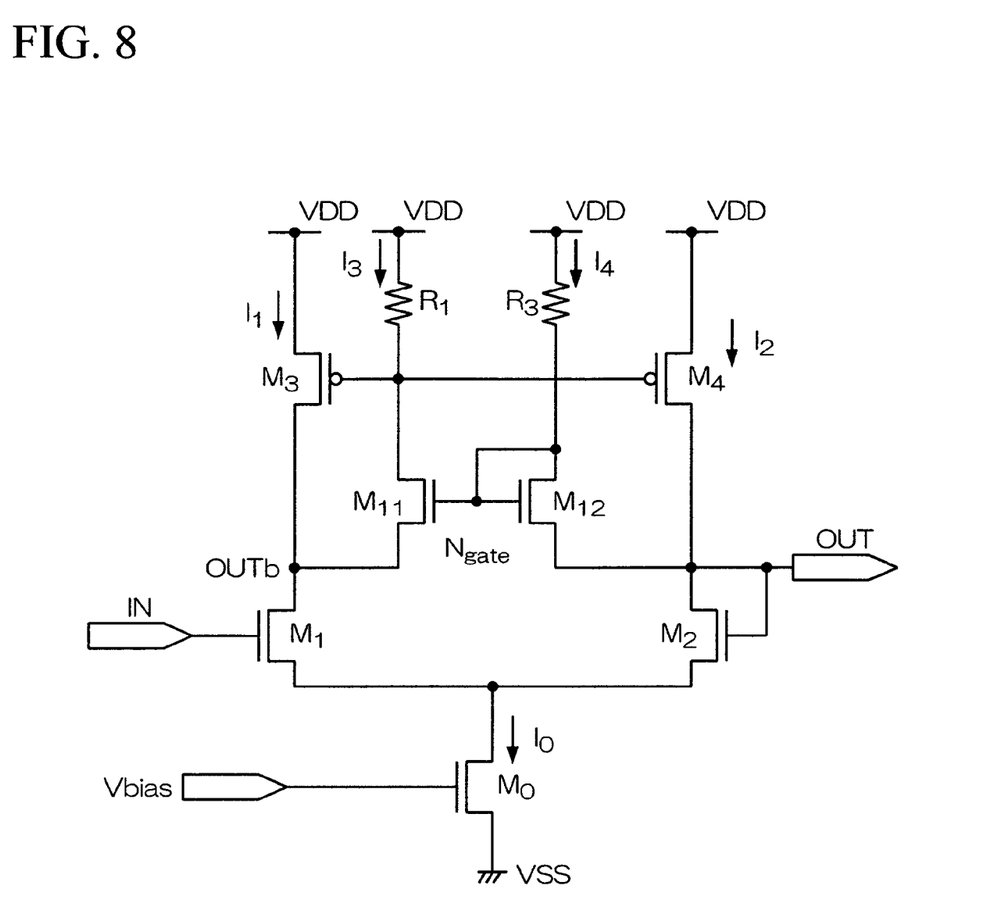
FIG. 8 is a circuit diagram showing the constitution of a differential amplification circuit according to a fourth embodiment of the present invention, which serves as a voltage follower circuit.

FIG. 8 shows the constitution of a differential amplification circuit according to a fourth embodiment of the present invention, which serves as a voltage follower circuit, wherein the parts identical to those shown in FIG. 7 are designated by the same reference numerals. Compared to the third embodiment of FIG. 7, the differential amplifier A1 (serving as the gate voltage control circuit) is replaced with a resistor R3 and an n-channel MOS transistor M12 in the fourth embodiment of FIG. 8. That is, the differential amplifier A1 is eliminated and is replaced with the resistor R3, which is connected between the voltage supply VDD and the drain of the transistor M12 so as to allow a current $I_4$ to flow therethrough, and the transistor M12 in which the gate thereof is connected to the drain thereof and the gate of the transistor M11, and the source thereof is connected to the output terminal OUT.

For the sake of simplification, the following description is made under the assumption in which R1=R3, and both the transistors M11 and M12 have the same size and in which the currents 13 and 14 flowing through the resistors R1 and R3 are very small and negligible in comparison with the currents $I_1$ and $I_2$ flowing through the transistors M3 and M4. In this case, a gate voltage V(Ngate) applied to the gates of the transistors M11 and M12 is expressed as V(Ngate)=V(OUT)+$V_{GS12}$. Therefore, the voltage V(OUTb) of the connection point OUTb is expressed as V(OUTb)=V(Ngate)−$V_{GS11}$=V(OUT)+$V_{GS12}$−$V_{GS11}$. Due to the above assumption in which VGS11=VGS12, it is possible to achieve the relationship of V(OUTb)=V(OUT); that is, the input offset voltage becomes zero in accordance with equation (1). The fourth embodiment does not need the differential amplifier A1; hence, it is possible to reduce the overall area of the circuitry.

Figure 9:
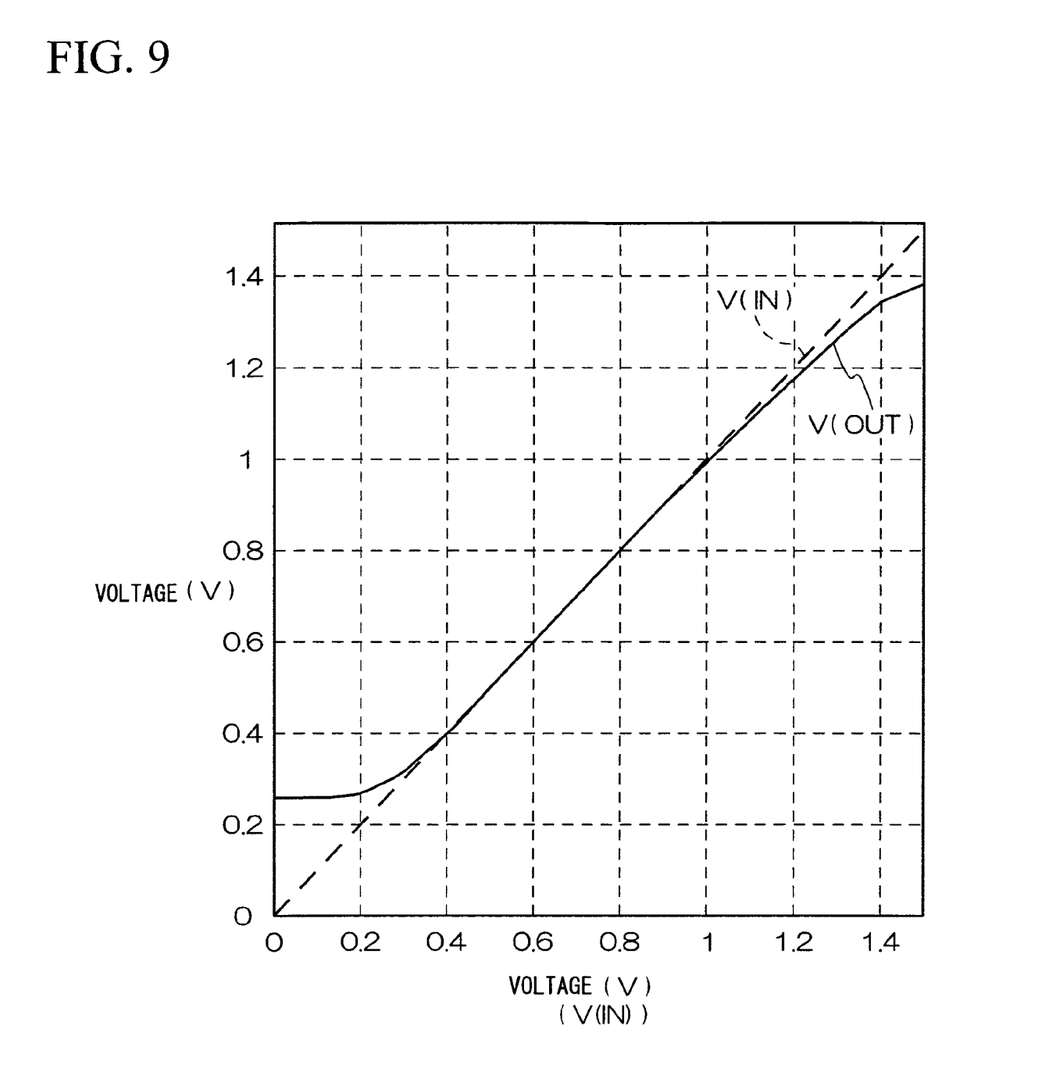
FIG. 9 is a graph showing the relationship between the input voltage and the output voltage in the voltage follower circuit of FIG. 8.

FIG. 9 shows the relationship between the input voltage and the output voltage in the voltage follower circuit of FIG. 8. It clearly indicates that the fourth embodiment can suppress the input offset voltage in a relatively broad range of the input voltage V(IN) ranging from 0.4 V to 1.1 V.

5. Fifth Embodiment

Figure 10:
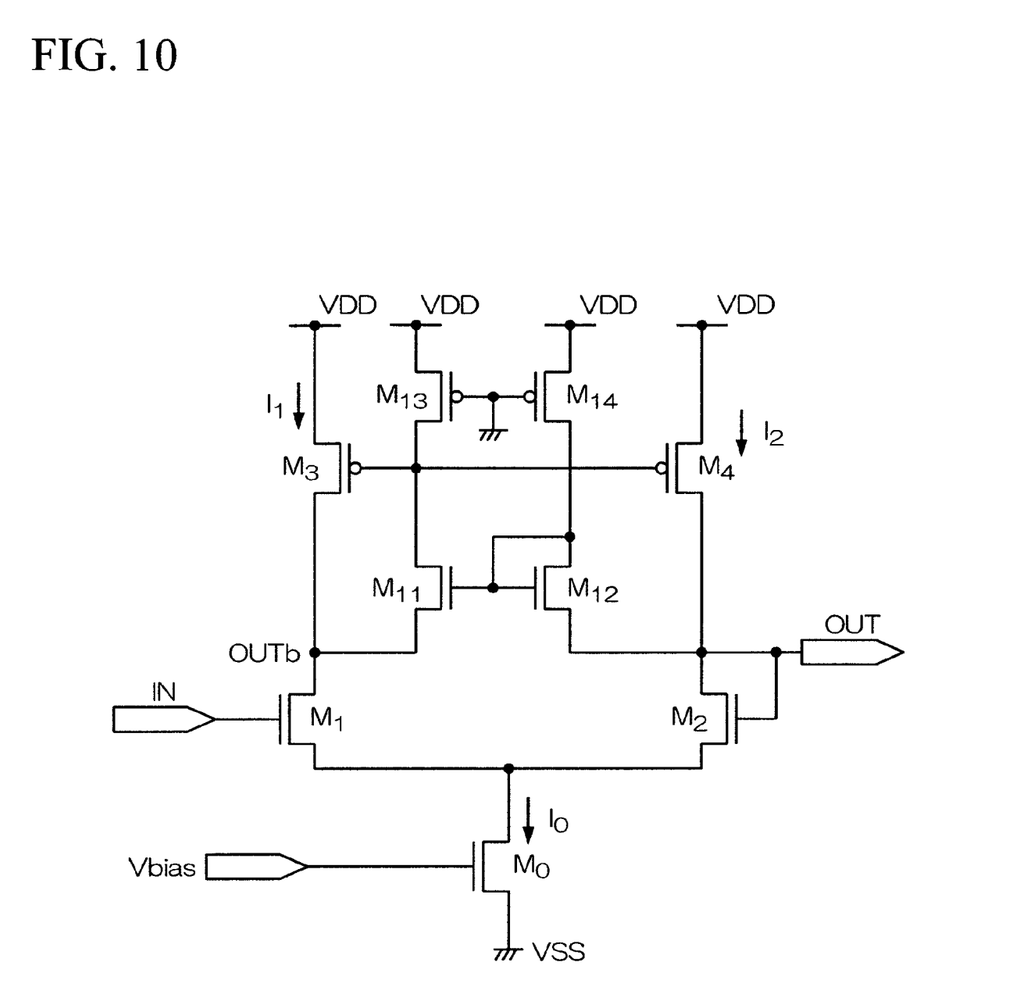
FIG. 10 is a circuit diagram showing the constitution of a differential amplification circuit according to a fifth embodiment of the present invention, which serves as a voltage follower circuit.

FIG. 10 shows the constitution of a differential amplification circuit according to a fifth embodiment of the present invention, which serves as a voltage follower circuit, wherein the parts identical to those shown in FIG. 8 are designated by the same reference numerals. Compared to the fourth embodiment of FIG. 8, the resistors R1 and R3 are replaced with p-channel MOS transistors M13 and M14 in the fifth embodiment of FIG. 10. That is, the resistors R1 and R3 are eliminated and are replaced with the transistor M13, in which the source thereof is connected to the voltage supply VDD and the drain thereof is connected to the drain of the transistor M11, and the transistor M14, in which the source thereof is connected to the voltage supply VDD and the drain thereof is connected to the drain of the transistor M12. Thus, it is possible to reduce the overall area of the circuitry by use of MOS transistors instead of resistors.

6. Effects

As described above, all the embodiments are designed to reduce the input offset voltage applied to the differential amplification circuit by placing both the connection point OUTb and the output terminal OUT at substantially the same potential.

The present invention is advantageous in that the margin of operation voltage of the circuitry is not reduced so much. This advantage will be briefly described below.

The operation points of transistors may differ from each other due to only the potential difference at the connection point OUTb in the circuitry of FIG. 2 compared with the foregoing circuitry of FIG. 12. In the first embodiment of FIG. 2, the minimum voltage required in the path configured of the transistors M0, M2, and M4 is identical to the minimum voltage required in the path configured of the transistors M0, M1, and M3. This indicates that the minimum operation voltage adapted to the circuitry of FIG. 2 may be determined in connection with only the path configured of the transistors M0, M2, and M4. Since the operation point of this path in the circuitry of FIG. 2 is identical to the operation point of the foregoing circuitry of FIG. 12, the present invention does not reduce the margin of operation voltage adapted to the foregoing circuitry.

In order to simplify the description regarding the input offset voltage, the present invention is described by way of examples of voltage follower circuits. Of course, the present invention is not necessarily limited to voltage follower circuits, and therefore it can be applied to any types of differential amplification circuits having functions of operational amplifiers.

It is apparent that the present invention is not limited to the above embodiments, but may be modified and changed without departing from the scope and spirit of the invention. For example, the embodiments can be modified such that capacities are additionally used for phase compensation, multiple sets of resistors are connected in series or in parallel, and transistors are aligned in parallel.

What is claimed is:

1. A differential amplification circuit comprising:
   a differential transistor pair which is constituted of a pair of n-channel MOS transistors whose gates are connected to a pair of differential input terminals, and whose sources are connected together;
   a current source circuit which is connected between the sources of the differential transistor pair and a ground, a gate of the current source circuit connected to a constant current bias voltage terminal;
   a current-mirror load circuit which is constituted of a pair of p-channel MOS transistors whose gates are connected together, whose sources are connected to a voltage supply, and whose drains are connected to drains of the n-channel MOS transistors forming the differential transistor pair; and
   a bias generation circuit for generating a gate bias voltage and a drain bias voltage applied to the p-channel MOS transistors forming the current-mirror load circuit in such a way that a same potential is set to both of the drains of the p-channel MOS transistors,
   wherein the bias generation circuit is constituted of a first resistor which is connected between the gates of the p-channel MOS transistors and the voltage supply, and a second resistor which is connected between the drain and the gate of one of the p-channel MOS transistors.

2. A differential amplification circuit comprising:
   a differential transistor pair which is constituted of a pair of n-channel MOS transistors whose gates are connected to a pair of differential input terminals, and whose sources are connected together;
   a current source circuit which is connected between the sources of the differential transistor pair and a ground, a gate of the current source circuit connected to a constant current bias voltage terminal;
   a current-mirror load circuit which is constituted of a pair of p-channel MOS transistors whose gates are connected together, whose sources are connected to a voltage supply, and whose drains are connected to drains of the n-channel MOS transistors forming the differential transistor pair; and
   a bias generation circuit for generating a gate bias voltage and a drain bias voltage applied to the p-channel MOS transistors forming the current-mirror load circuit in such a way that a same potential is set to both of the drains of the p-channel MOS transistors,
   wherein the bias generation circuit is constituted of a p-channel MOS transistor which is connected between the voltage supply and the gates of the p-channel MOS transistors forming the current-mirror load circuit, a resistor which is connected between the drain and the gate of one of the p-channel MOS transistors forming the current-mirror load circuit, and a differential amplifier whose output terminal is connected to a gate of the p-channel MOS transistor, whose inverting input terminal is connected to the drain of the one of the p-channel MOS transistors forming the current-mirror load circuit, and whose noninverting input terminal is connected to the drain of an other of the p-channel MOS transistors forming the current-mirror load circuit.

3. A differential amplification circuit comprising:
   a differential transistor pair which is constituted of a pair of n-channel MOS transistors whose gates are connected to a pair of differential input terminals, and whose sources are connected together;
   a current source circuit which is connected between the sources of the differential transistor pair and a ground, a gate of the current source circuit connected to a constant current bias voltage terminal;
   a current-mirror load circuit which is constituted of a pair of p-channel MOS transistors whose gates are connected together, whose sources are connected to a voltage supply, and whose drains are connected to drains of the n-channel MOS transistors forming the differential transistor pair; and
   a bias generation circuit for generating a gate bias voltage and a drain bias voltage applied to the p-channel MOS transistors forming the current-mirror load circuit in such a way that a same potential is set to both of the drains of the p-channel MOS transistors,
   wherein the bias generation circuit is constituted of a resistor which is connected between the voltage supply and the gates of the p-channel MOS transistors forming the current-mirror load circuit, an n-channel MOS transistor which is connected between the drain and the gate of one of the p-channel MOS transistors forming the current-mirror load circuit, and a differential amplifier whose output terminal is connected to a gate of the n- channel MOS transistor, whose inverting input terminal is connected to the drain of the one of the p-channel MOS transistors forming the current-mirror load circuit, and whose noninverting input terminal is connected to the drain of an other of the p-channel MOS transistors forming the current-mirror load circuit.

4. A differential amplification circuit comprising:
   a differential transistor pair which is constituted of a pair of n-channel MOS transistors whose gates are connected to a pair of differential input terminals, and whose sources are connected together;
   a current source circuit which is connected between the sources of the differential transistor pair and a ground, a gate of the current source circuit connected to a constant current bias voltage terminal;
   a current-mirror load circuit which is constituted of a pair of p-channel MOS transistors whose gates are connected together, whose sources are connected to a voltage supply, and whose drains are connected to drains of the n-channel MOS transistors forming the differential transistor pair; and a bias generation circuit for generating a gate bias voltage and a drain bias voltage applied to the p-channel MOS transistors forming the current-mirror load circuit in such a way that a same potential is set to both of the drains of the p-channel MOS transistors, wherein the bias generation circuit is constituted of a first resistor which is connected between the voltage supply and the gates of the p-channel MOS transistors forming the current-mirror load circuit, a first n-channel MOS transistor which is connected between the drain and the gate of one of the p-channel MOS transistors forming the current-mirror load circuit, a second n-channel MOS transistor whose source is connected to the drain of an other of the p-channel MOS transistors forming the current-mirror load circuit and whose gate and drain are connected to a gate of the first n-channel MOS transistor, and a second resistor which is connected between the voltage supply and the gate of the second n-channel MOS transistor.

5. A differential amplification circuit according to claim 4, wherein the first resistor and the second resistor are replaced with a pair of MOS transistors.

6. A differential amplification circuit according to claim 1, wherein one of the differential input terminals is connected to the drain of one of the p-channel MOS transistors forming the current-mirror load circuit so as to form a voltage follower circuit.

7. A differential amplification circuit according to claim 2, wherein one of the differential input terminals is connected to the drain of one of the p-channel MOS transistors forming the current-mirror load circuit so as to form a voltage follower circuit.

8. A differential amplification circuit according to claim 3, wherein one of the differential input terminals is connected to the drain of one of the p-channel MOS transistors forming the current-mirror load circuit so as to form a voltage follower circuit.

9. A differential amplification circuit according to claim 4, wherein one of the differential input terminals is connected to the drain of one of the p-channel MOS transistors forming the current-mirror load circuit so as to form a voltage follower circuit.

10. A differential amplification circuit according to claim 5, wherein one of the differential input terminals is connected to the drain of one of the p-channel MOS transistors forming the current-mirror load circuit so as to form a voltage follower circuit.

11. A differential amplification circuit comprising:
a differential transistor pair which includes a first transistor coupled between a first common node and a first output node, a gate coupled to a first input terminal, a second transistor coupled between said first common node and a second output node, and a gate coupled to a second input terminal;
a current source transistor which is coupled between said first common node and a first voltage supply line and which includes a gate coupled to a bias voltage terminal;
a current-mirror load circuit which includes a third transistor coupled between said first output node and a second voltage supply line, a gate coupled to a second common node, a fourth transistor coupled between said second output node and said second voltage supply line, and a gate coupled to said second common node; and a bias generation circuit which includes a first resistive element coupled between said second voltage supply line and said second common node, and a second resistive element coupled between said second common node and said first output node, wherein each of said first and second resistive elements is a resistor.

12. The differential amplification circuit according to claim 11, wherein a resistance value of said first resistive element and said second resistive element is defined such that a current flowing through said first and second resistive elements is smaller than that of said third and fourth transistors.

13. A differential amplification circuit comprising:
a differential transistor pair which includes a first transistor coupled between a first common node and a first output node, a gate coupled to a first input terminal, a second transistor coupled between said first common node and a second output node, and a gate coupled to a second input terminal;
a current source transistor which is coupled between said first common node and a first voltage supply line and which includes a gate coupled to a bias voltage terminal;
a current-mirror load circuit which includes a third transistor coupled between said first output node and a second voltage supply line, a gate coupled to a second common node, a fourth transistor coupled between said second output node and said second voltage supply line, and a gate coupled to said second common node; and
a bias generation circuit which includes a first resistive element coupled between said second voltage supply line and said second common node, and a second resistive element coupled between said second common node and said first output node, wherein said bias generation circuit includes an amplifier circuit which includes a first input node coupled to said first output node, a second input node coupled to said second output node, and an output node coupled to one of said first and second resistive elements to control a resistance value of one of said first and second resistive elements.

14. A differential amplification circuit comprising:
a differential transistor pair which includes a first transistor coupled between a first common node and a first output node, a gate coupled to a first input terminal, a second transistor coupled between said first common node and a second output node, and a gate coupled to a second input terminal;
a current source transistor which is coupled between said first common node and a first voltage supply line and which includes a gate coupled to a bias voltage terminal;
a current-mirror load circuit which includes a third transistor coupled between said first output node and a second voltage supply line, a gate coupled to a second common node, a fourth transistor coupled between said second output node and said second voltage supply line, and a gate coupled to said second common node; and
a bias generation circuit which includes a first resistive element coupled between said second voltage supply line and said second common node, and a second resistive element coupled between said second common node and said first output node, wherein said second resistive element is a fifth transistor including a gate coupled to a third common node.

15. The differential amplification circuit according to claim 14, wherein said bias generation circuit includes a third resistive element coupled between said second voltage supply line and said third common node, a sixth transistor coupled between said third common node and said second output node, and a gate coupled to said third common node.

16. The differential amplification circuit according to claim 15, wherein said first resistive element is a seventh transistor including a gate coupled to a fourth common node, and said third resistive element is an eighth transistor including a gate coupled to said fourth common node.

17. The differential amplification circuit according to claim 13, wherein a resistance value of said first resistive element and said second resistive element is defined such that a current flowing through said first and second resistive elements is smaller than that of said third and fourth transistors.

18. The differential amplification circuit according to claim 13, wherein a resistance value of said first resistive element and said second resistive element is defined such that a current flowing through said first and second resistive elements is smaller than that of said third and fourth transistors.

* * * * *